(12) United States Patent
Li et al.

(10) Patent No.: US 10,559,675 B2
(45) Date of Patent: Feb. 11, 2020

(54) STACKED SILICON NANOTUBES

(71) Applicant: International Business Machines Corporation, Armonk, NY (US)

(72) Inventors: Juntao Li, Cohoes, NY (US); Kangguo Cheng, Schenectady, NY (US); Choonghyun Lee, Rensselaer, NY (US); Peng Xu, Sunnyvale, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/850,059

(22) Filed: Dec. 21, 2017

(65) Prior Publication Data

US 2019/0198637 A1 Jun. 27, 2019

(51) Int. Cl.
*H01L 29/66* (2006.01)
*H01L 29/423* (2006.01)
(Continued)

(52) U.S. Cl.
CPC ...... *H01L 29/6681* (2013.01); *H01L 21/2255* (2013.01); *H01L 21/3065* (2013.01); *H01L 29/0673* (2013.01); *H01L 29/42392* (2013.01); *H01L 29/6653* (2013.01); *H01L 29/66477* (2013.01); *H01L 29/66553* (2013.01); *H01L 29/7853* (2013.01); *H01L 21/0228* (2013.01); *H01L 21/02112* (2013.01); *H01L 21/02321* (2013.01)

(58) Field of Classification Search
CPC ........... H01L 29/66795; H01L 29/6681; H01L 29/785; H01L 29/42392; H01L 29/0673; H01L 29/6653; H01L 29/7853; H01L 21/324; H01L 21/2255; H01L 21/2251; H01L 21/2254
See application file for complete search history.

(56) References Cited

U.S. PATENT DOCUMENTS 7,868,374 B2 1/2011 Cheng et al.
8,679,902 B1 3/2014 Basker et al.
(Continued)

OTHER PUBLICATIONS

Lee, C., et. al. (2016). Selective GeOx-scavenging from interfacial layer on Si1-xGex channel for high mobility Si/Si1-xGex CMOS application. 2016 IEEE Symposium on VLSI Technology, 1-2 (Year: 2016).*

(Continued)

*Primary Examiner* — Mohammed Shamsuzzaman
*Assistant Examiner* — Aaron J Gray
(74) *Attorney, Agent, or Firm* — Cantor Colburn LLP; Vazken Alexanian

(57) ABSTRACT

Embodiments of the present invention are directed to a method that incorporates a germanium pull-out process to form semiconductor structures having stacked silicon nanotubes. In a non-limiting embodiment of the invention, a sacrificial layer is formed over a substrate. The sacrificial layer includes a first type of semiconductor material. A pull-out layer is formed on the sacrificial layer. The first type of semiconductor material from the sacrificial layer is removed to form a silicon-rich layer on a surface of the sacrificial layer. The sacrificial layer can be removed such that the silicon-rich layer defines a silicon nanotube.

14 Claims, 15 Drawing Sheets

(51) Int. Cl.
H01L 29/78 (2006.01)
H01L 29/06 (2006.01)
H01L 21/225 (2006.01)
H01L 21/02 (2006.01)
H01L 21/3065 (2006.01)

(56) References Cited

U.S. PATENT DOCUMENTS

| | | | |
|---|---|---|---|
| 8,871,576 | B2 | 10/2014 | Tekleab et al. |
| 9,171,715 | B2 | 10/2015 | Matero |
| 9,224,813 | B2 | 12/2015 | Hussain et al. |
| 9,773,875 | B1 * | 9/2017 | Jagannathan ......... H01L 29/165 |
| 2005/0051805 | A1 | 3/2005 | Kim et al. |
| 2011/0210309 | A1 * | 9/2011 | Ben-Ishai .............. B82Y 10/00 257/9 |
| 2013/0032777 | A1 | 2/2013 | Yin et al. |
| 2014/0091279 | A1 | 4/2014 | Kachian et al. |
| 2017/0005180 | A1 | 1/2017 | Cheng et al. |
| 2017/0113928 | A1 | 4/2017 | Goehlich et al. |
| 2018/0175167 | A1 * | 6/2018 | Reboh ............... H01L 29/78696 |

OTHER PUBLICATIONS

Chao et al., "Bottom Channel Isolation in Nanosheet Transistors," U.S. Appl. No. 15/493,730, filed Apr. 21, 2017.
Sahay et al., "Comprehensive Analysis of Gate-Induced Drain Leakage in Emerging FET Architectures: Nanotube FETs Versus Nanowire FETs," IEEE Access, vol. 5, 2017, pp. 18918-18926.
Wang et al., "Desorption kinetics of GeO from GeO2/Ge structure," Journal of Applied Physics, vol. 108, No. 5, 2010, 054104, 8 pages.
Lin Chen et al., "Semiconductor Nanowire Growth and Integration", Semiconductor Nanowires: From Next-Generation Electronics to Sustainable Energy, pp. 1-53, 2014, The Royal Society of Chemistry.
List of IBM Patents or Patent Applications Treated as Related; (Appendix P), Date Filed Aug. 7, 2019; 2 pages.
Juntao Li et al."Stacked Silicon Nanotubes", U.S. Appl. No. 16/534,088, filed Aug. 7, 2019.

* cited by examiner

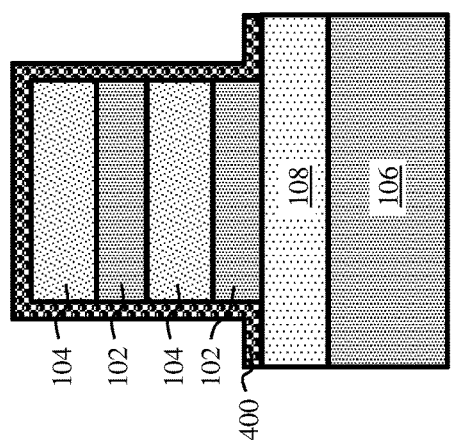
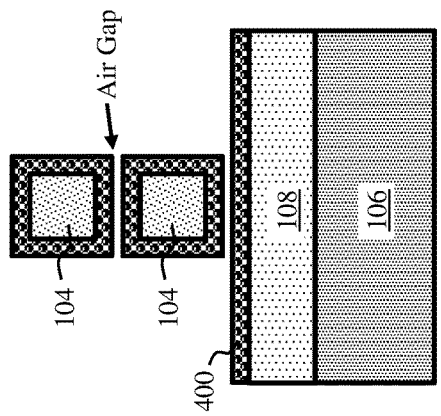
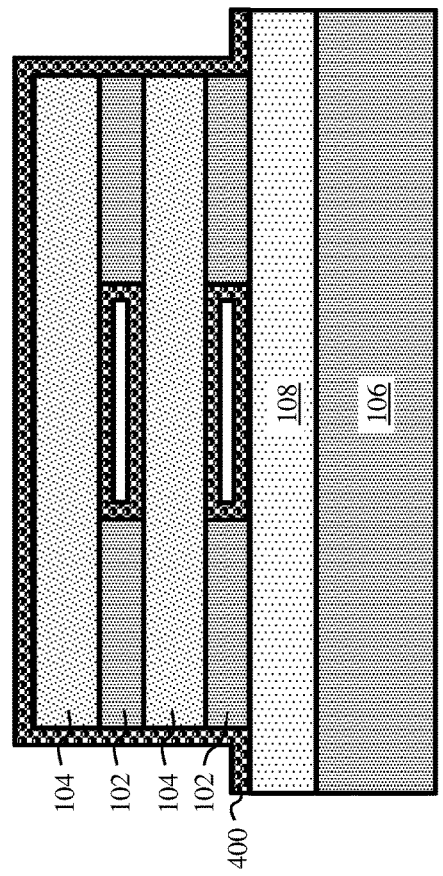

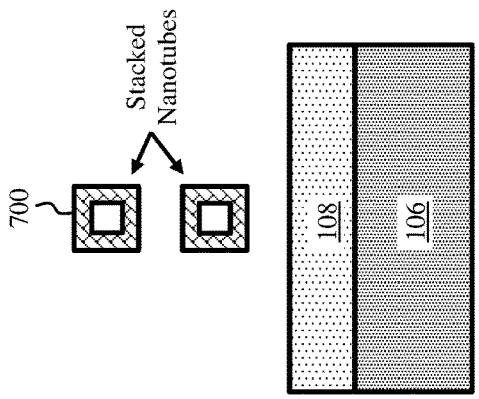
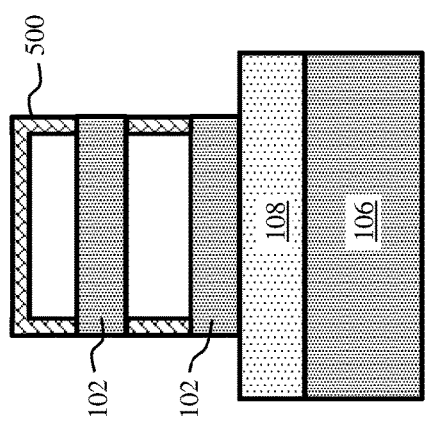
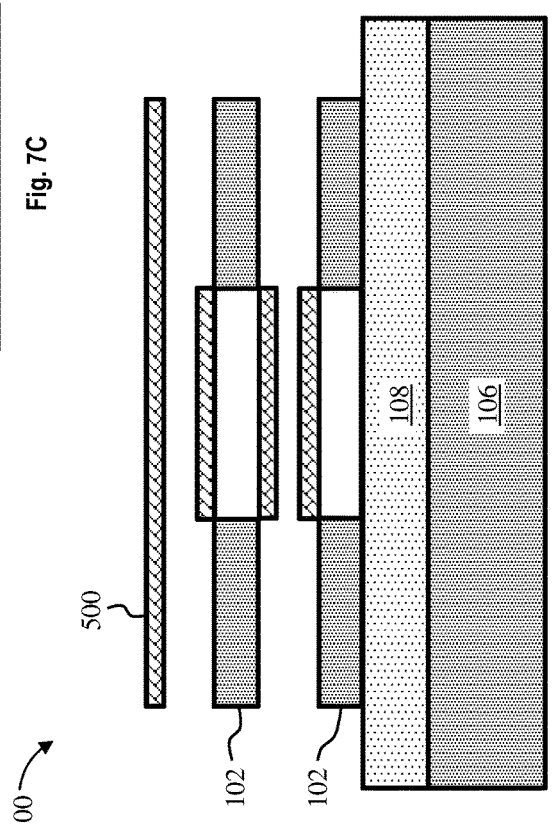

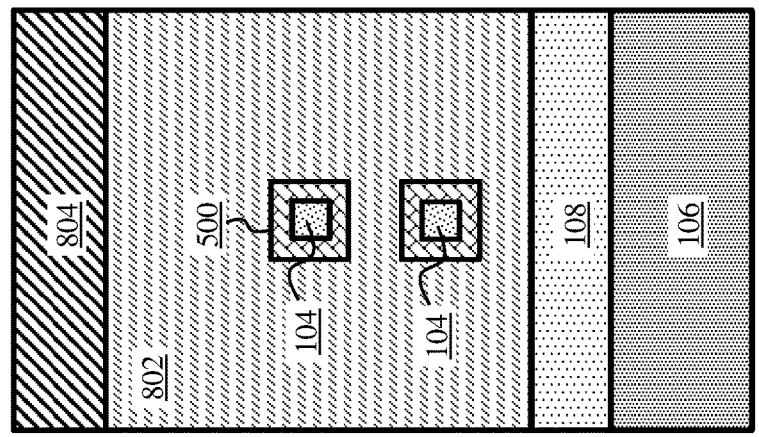
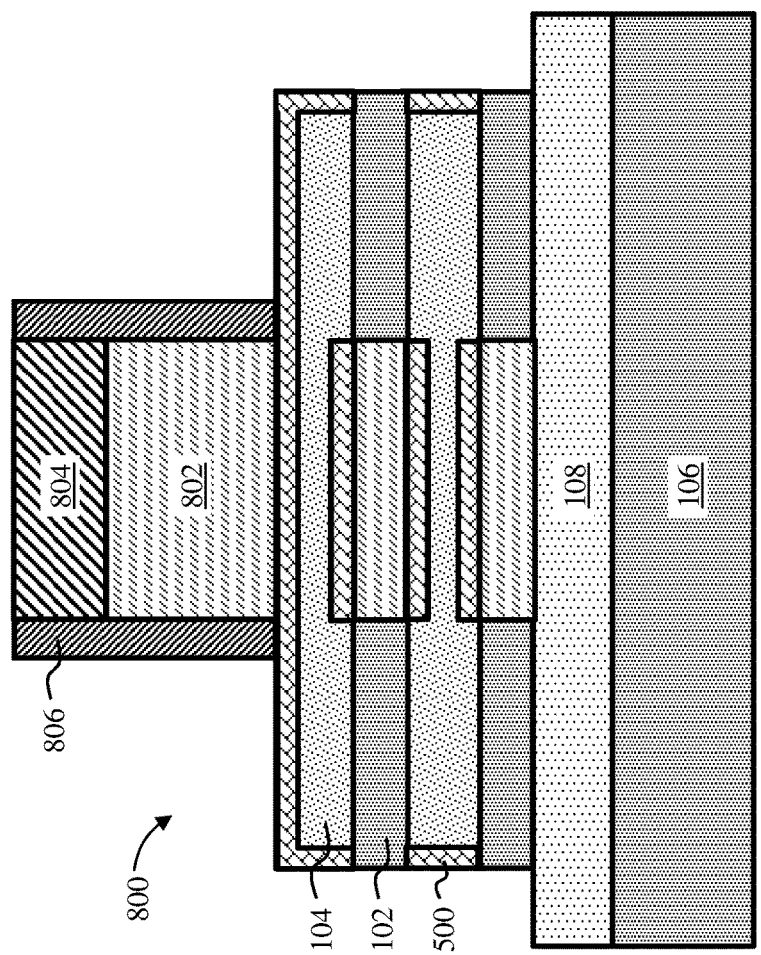
Fig. 8B
Fig. 8A

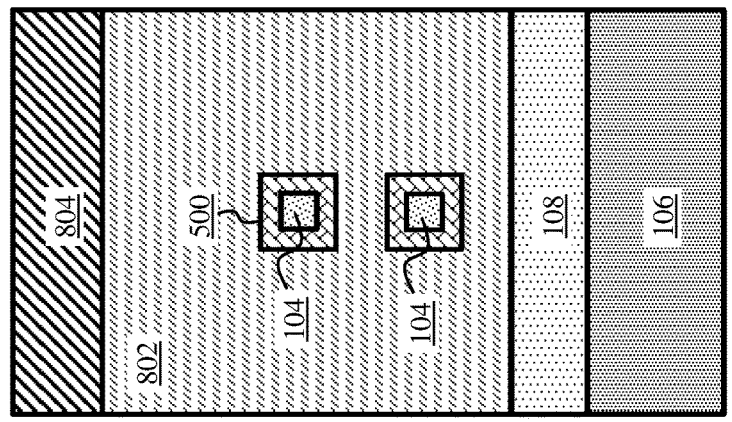
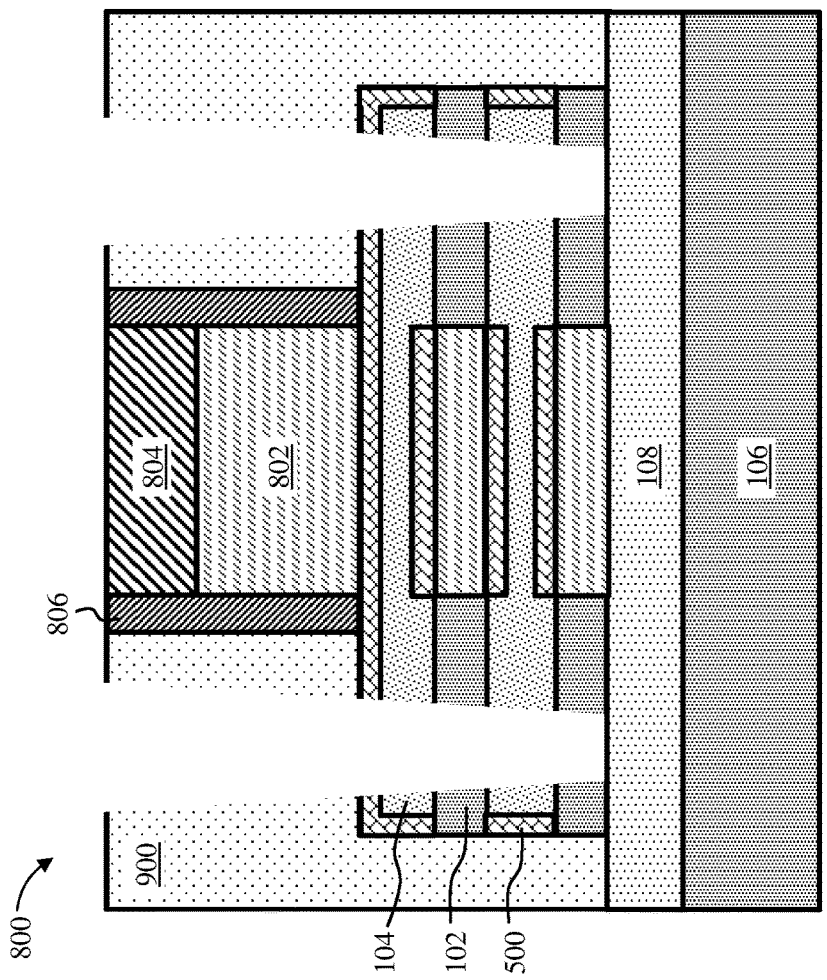
Fig. 9A
Fig. 9B

STACKED SILICON NANOTUBES

BACKGROUND

The present invention generally relates to fabrication methods and resulting structures for semiconductor devices. More specifically, the present invention relates to a novel design for a stacked silicon nanotube.

Traditional CMOS (Complementary Metal Oxide Semiconductor) fabrication techniques include process flows for constructing planar transistors. With planar transistors, transistor density can be increased by decreasing the pitch between transistor gate elements. However, with planar transistors, the ability to decrease gate pitch is limited by the required gate length and spacer thickness. In recent years, research has been devoted to the development of nonplanar transistor architectures. Some non-planar transistor architectures, such as vertical field effect transistors (VFETs) and stacked silicon nanotube field effect transistors (FETs), employ semiconductor channels with various gate-all-around (GAA) technologies to achieve increased device density, greater power efficiency, and some increased performance over lateral devices. In a stacked nanotube FET, the gate stack wraps around the full perimeter of each nanosheet, enabling fuller depletion in the channel region, and reducing short-channel effects due to steeper subthreshold swing (SS) and smaller drain induced barrier lowering (DIBL). The wrap-around gate structures and source/drain contacts used in nanotube-based devices also enable greater management of leakage current and parasitic capacitance in the active regions, even as drive currents increase.

SUMMARY

Embodiments of the present invention are directed to a method that incorporates a germanium pull-out process to form semiconductor structures having stacked silicon nanotubes. A non-limiting example of the method includes forming a sacrificial layer of germanium over a substrate. A pull-out layer is formed on the sacrificial layer. Germanium from the sacrificial layer is removed to form a silicon-rich layer on a surface of the sacrificial layer. The sacrificial layer can be removed such that the silicon-rich layer defines a silicon nanotube.

Embodiments of the present invention are directed to a method that incorporates a germanium pull-out process to form semiconductor structures having stacked silicon nanotubes. A non-limiting example of the method includes forming a semiconductor layer on a substrate. A sacrificial layer of germanium is formed on the semiconductor layer. The semiconductor layer and the sacrificial layer are patterned into one or more fins in a first region of the substrate. Portions of the semiconductor layer in the first region are removed such that a portion of the sacrificial layer in the first region defines a nanowire. A germanium pull-out layer is formed around the nanowire in the first region. The semiconductor device is annealed to remove germanium from a surface of the nanowire such that the surface of the nanowire becomes silicon-rich.

Embodiments of the invention are directed to a semiconductor structure having stacked silicon nanotubes. A non-limiting example of the semiconductor device includes one or more stacked silicon nanotubes formed over a substrate. A dielectric core is formed in each of the one or more stacked silicon nanotubes. A gate wraps around a channel region of each of the one or more stacked silicon nanotubes.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4A depicts a cross-sectional view of the semiconductor structure shown in FIG. 3 taken along the line A-A' after a processing operation according to one or more embodiments of the invention;

FIG. 4B depicts a cross-sectional view of the semiconductor structure shown in FIG. 3 taken along the line B-B' after a processing operation according to one or more embodiments of the invention;

FIG. 4C depicts a cross-sectional view of the semiconductor structure shown in FIG. 3 taken along the line C-C' after a processing operation according to one or more embodiments of the invention;

FIG. 7A depicts a cross-sectional view of the semiconductor structure shown in FIG. 3 taken along the line A-A' after a processing operation according to one or more embodiments of the invention;

FIG. 7B depicts a cross-sectional view of the semiconductor structure shown in FIG. 3 taken along the line B-B' after a processing operation according to one or more embodiments of the invention;

Figure 3:
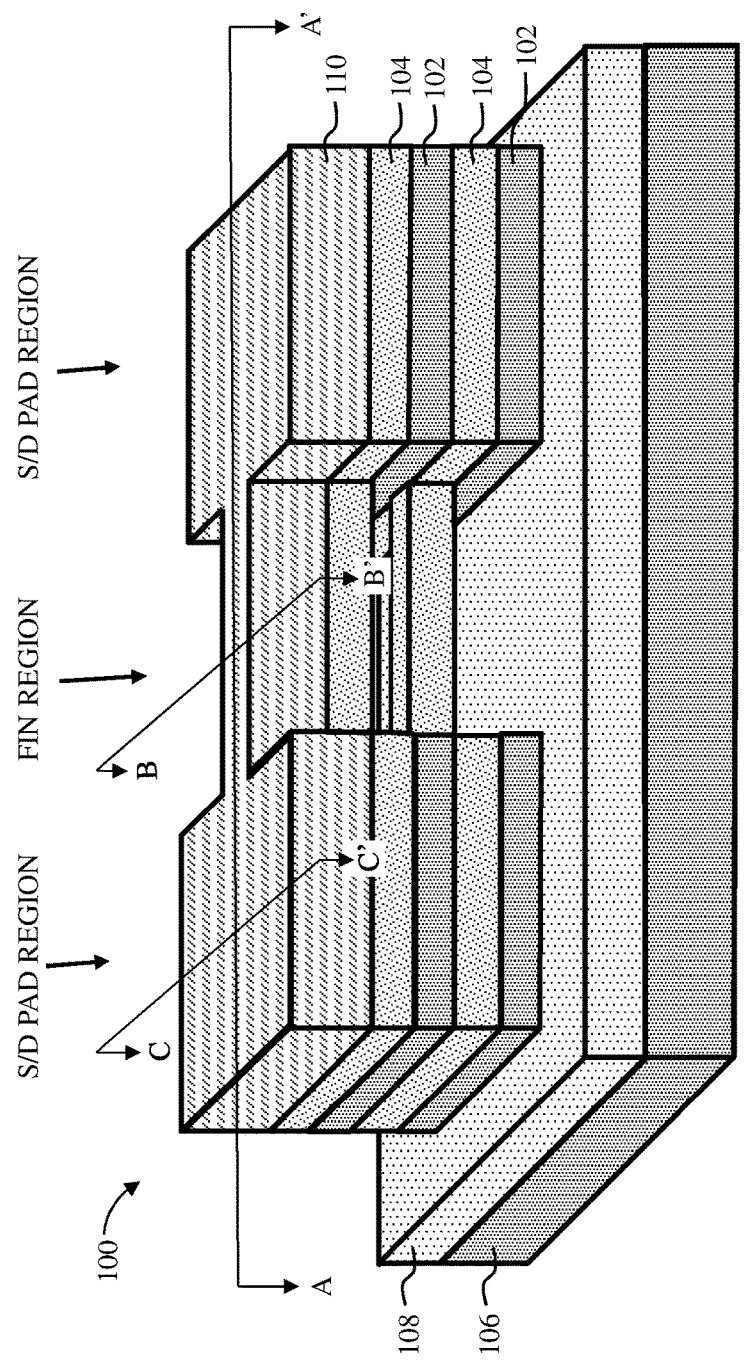
FIG. 3 depicts an isometric view of the semiconductor structure after a processing operation according to one or more embodiments of the invention.
Figure 10A:
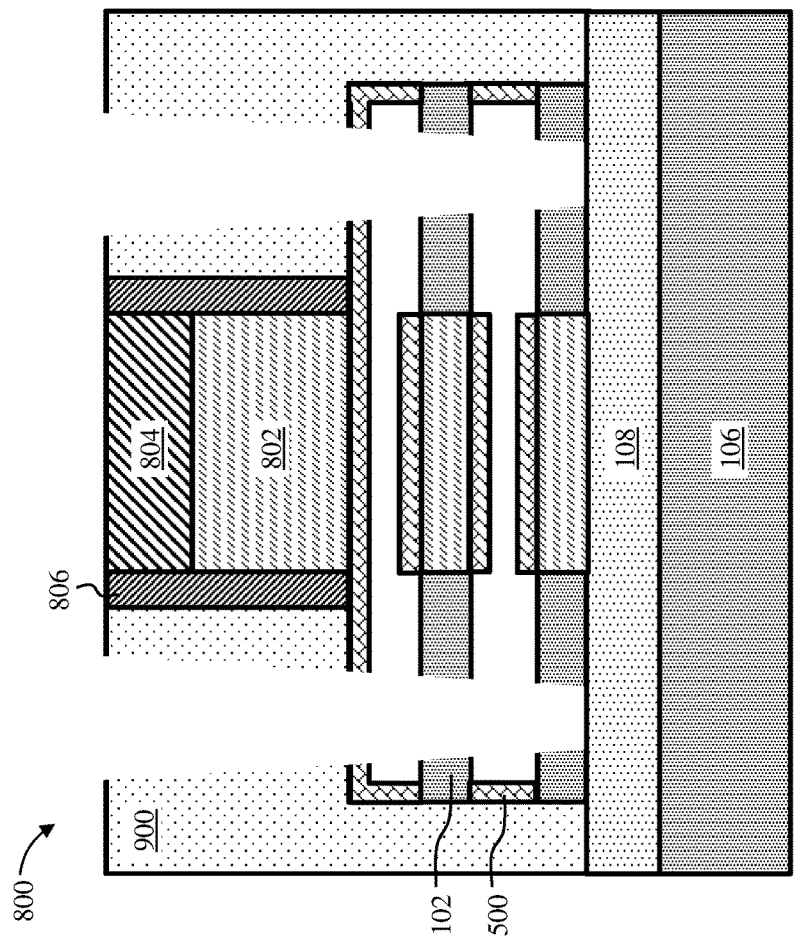
Figure 10B:
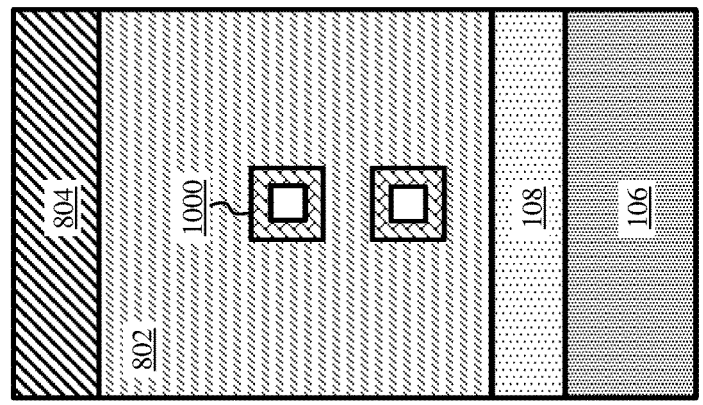
Figure 11B:
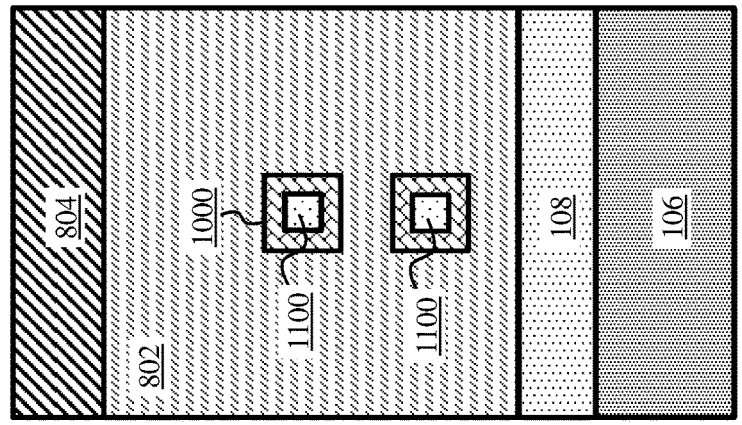
Figure 11A:
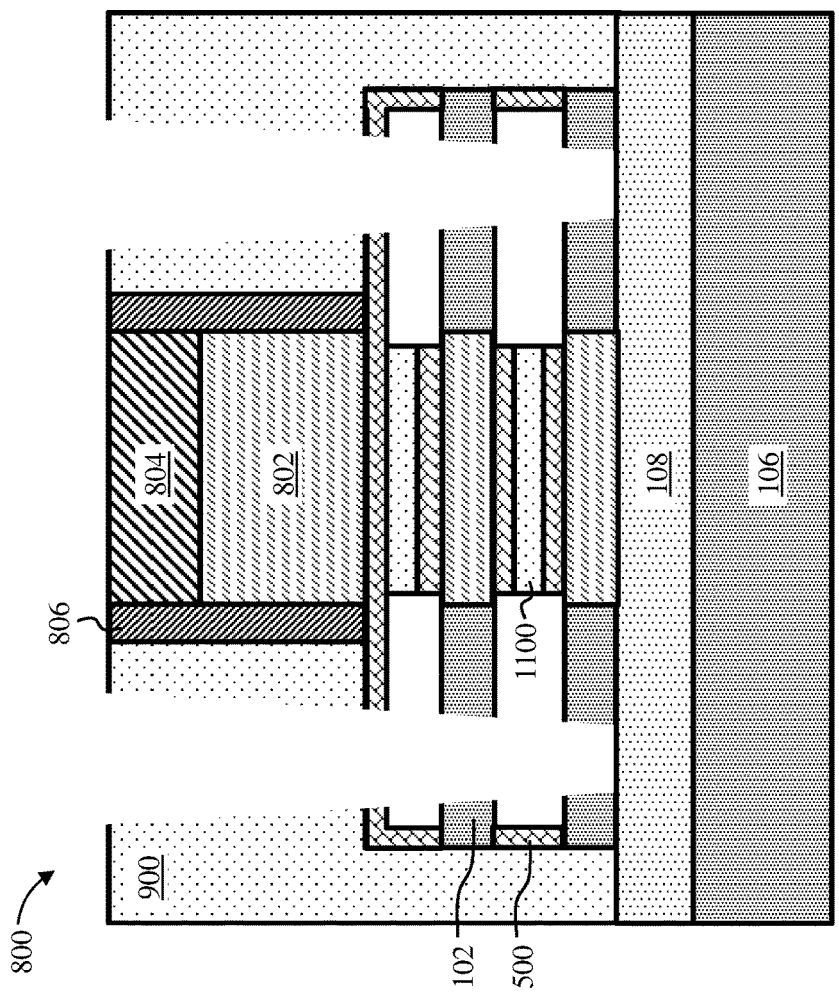
Figure 12B:
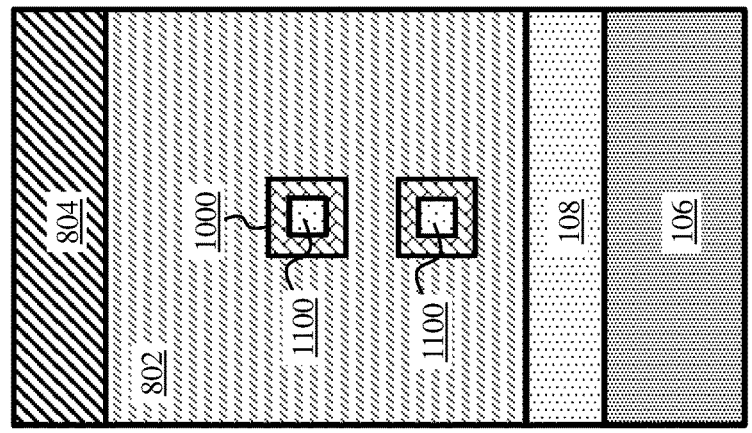
Figure 12A:
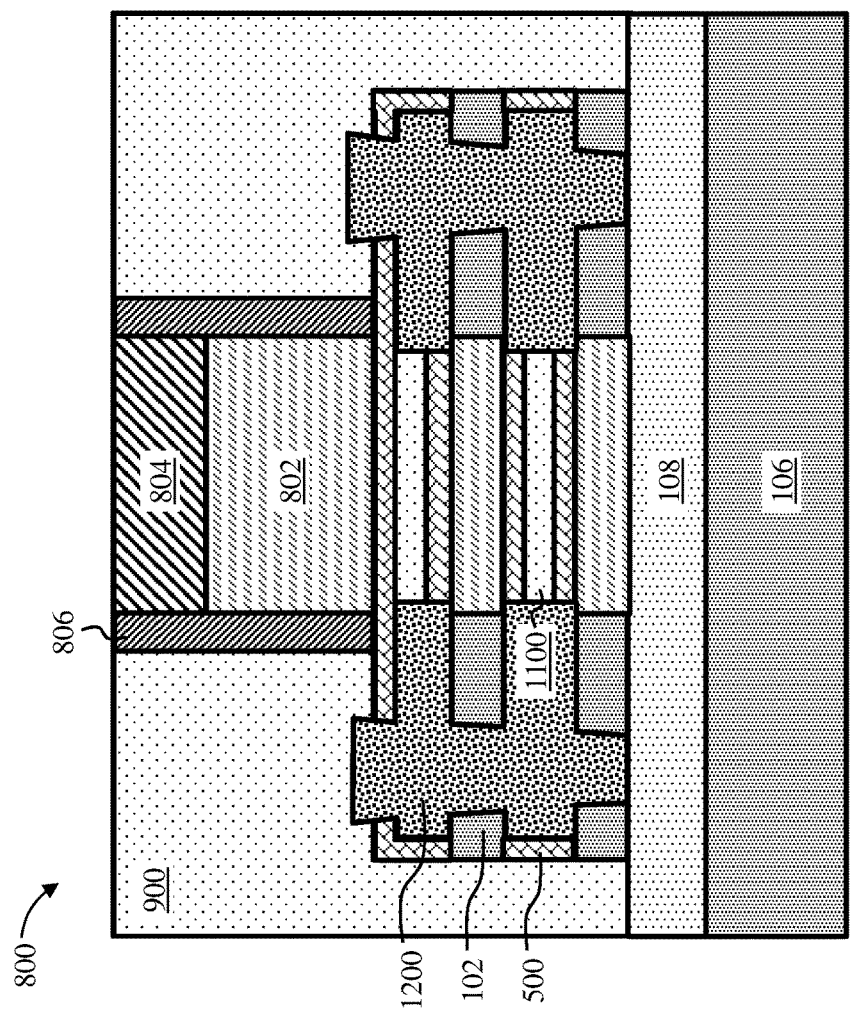
Figures 13A, 13B:
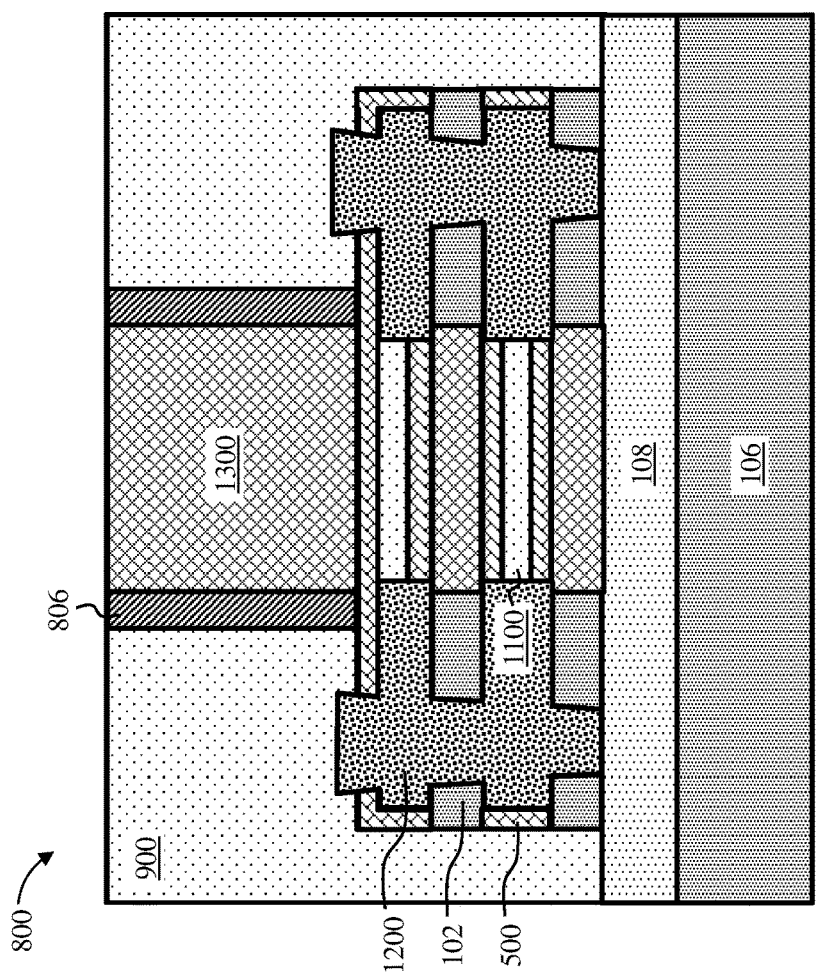
Figure 14:
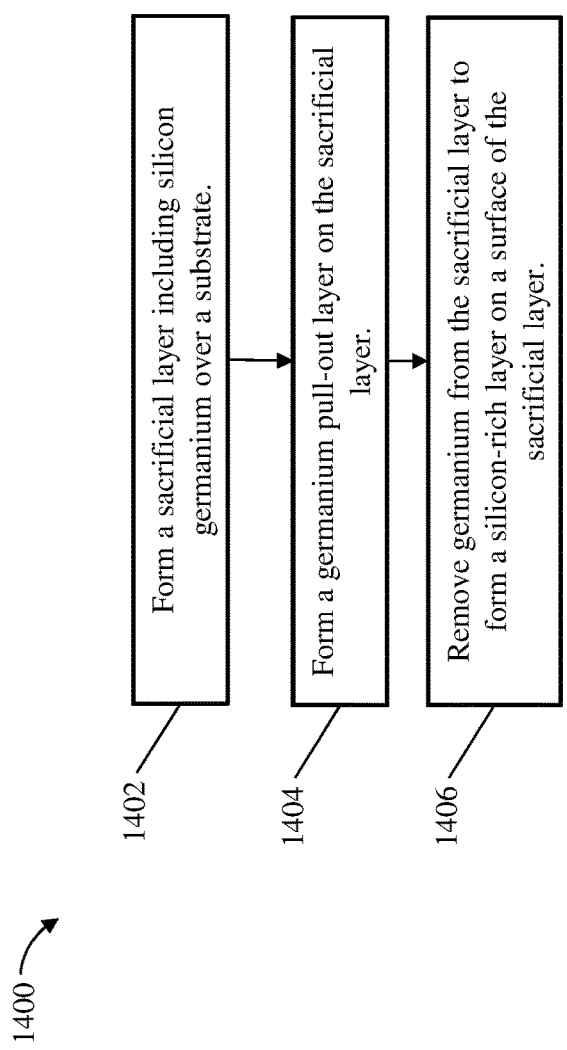
Figure 15:
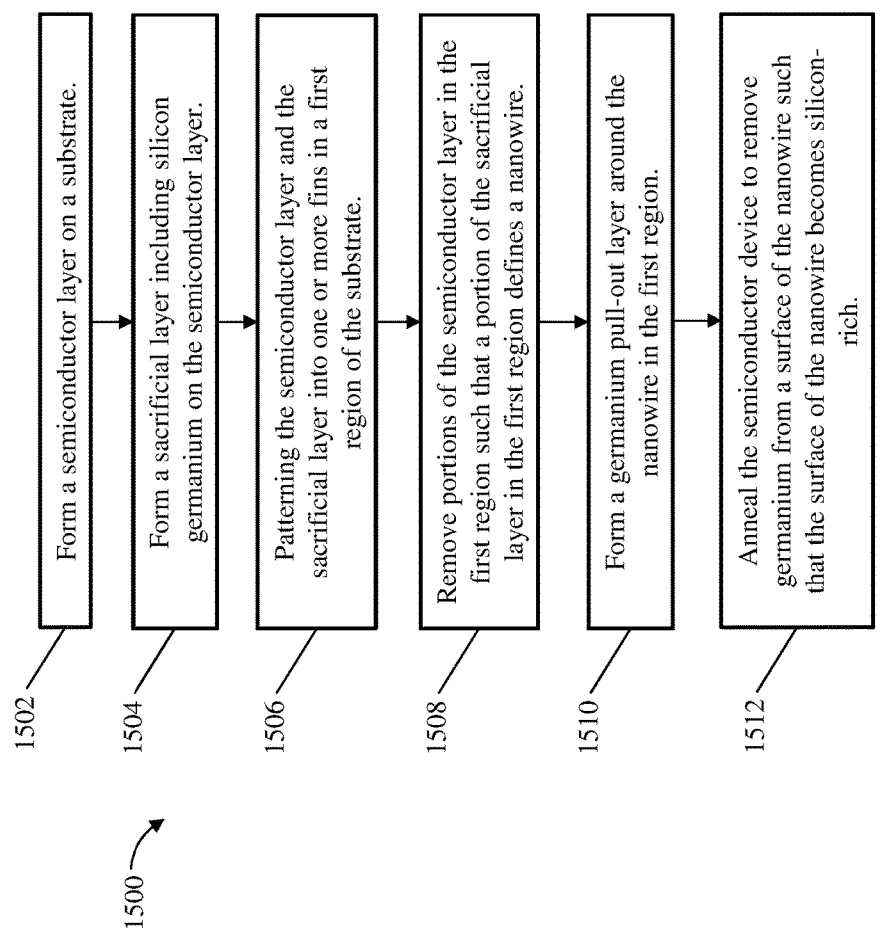

FIG. 7C depicts a cross-sectional view of the semiconductor structure shown in FIG. 3 taken along the line C-C' after a processing operation according to one or more embodiments of the invention;

FIG. 8A depicts a cross-sectional view of the semiconductor structure shown in FIG. 3 taken along the line A-A' after a processing operation according to one or more embodiments of the invention;

FIG. 8B depicts a cross-sectional view of the semiconductor structure shown in FIG. 3 taken along the line B-B' after a processing operation according to one or more embodiments of the invention;

FIG. 9A depicts a cross-sectional view of the semiconductor structure shown in FIG. 3 taken along the line A-A' after a processing operation according to one or more embodiments of the invention;

FIG. 9B depicts a cross-sectional view of the semiconductor structure shown in FIG. 3 taken along the line B-B' after a processing operation according to one or more embodiments of the invention;

FIG. 10A depicts a cross-sectional view of the semiconductor structure shown in FIG. 3 taken along the line A-A' after a processing operation according to one or more embodiments of the invention;

FIG. 10B depicts a cross-sectional view of the semiconductor structure shown in FIG. 3 taken along the line B-B' after a processing operation according to one or more embodiments of the invention;

FIG. 11A depicts a cross-sectional view of the semiconductor structure shown in FIG. 3 taken along the line A-A' after a processing operation according to one or more embodiments of the invention;

FIG. 11B depicts a cross-sectional view of the semiconductor structure shown in FIG. 3 taken along the line B-B' after a processing operation according to one or more embodiments of the invention;

FIG. 12A depicts a cross-sectional view of the semiconductor structure shown in FIG. 3 taken along the line A-A' after a processing operation according to one or more embodiments of the invention;

FIG. 12B depicts a cross-sectional view of the semiconductor structure shown in FIG. 3 taken along the line B-B' after a processing operation according to one or more embodiments of the invention;

FIG. 13A depicts a cross-sectional view of the semiconductor structure shown in FIG. 3 taken along the line A-A' after a processing operation according to one or more embodiments of the invention;

FIG. 13B depicts a cross-sectional view of the semiconductor structure shown in FIG. 3 taken along the line B-B' after a processing operation according to one or more embodiments of the invention;

FIG. 14 depicts a flow diagram illustrating a method according to one or more embodiments of the invention; and FIG. 15 depicts a flow diagram illustrating a method according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, as previously noted herein, some non-planar transistor device architectures, such as stacked nanotube FETs, employ gate-all-around (GAA) technologies, whereby the gate stack wraps around the full perimeter of each nanotube, enabling fuller depletion in the channel region, and reducing short-channel effects due to steeper subthreshold swing (SS) and smaller drain induced barrier lowering (DIBL). There are challenges, however, in scaling stacked nanotube FETs beyond the 10 nm node. One such challenge is the difficulty in fabricating high density, uniform silicon nanotubes.

Turning now to an overview of aspects of the present invention, one or more embodiments of the invention provide a novel design and fabrication method for providing stacked silicon nanotubes. The high density, uniform silicon nanotube architecture described herein leverages a $GeO_2$ deposition and subsequent germanium pull-out process to selectively form a silicon-rich surface on a silicon germanium (SiGe) layer according to the formula:

$$Ge + GeO_2 \rightarrow 2GeO. \tag{I}$$

A "silicon-rich" surface is defined as a surface having a higher concentration of silicon than the underlying SiGe layer. Advantageously, this germanium pull-out process can be well-controlled, as the reaction of $GeO_2$ with the germanium (Ge) in a SiGe layer only occurs during a high temperature spike anneal, at a temperature above about 900 degrees Celsius. At these temperatures there is no reaction of $GeO_2$ with pure silicon. In other words, this germanium pull-out process is highly selective to SiGe. During the germanium pull-out process GeO desorption occurs (GeO is a volatile species), removing Ge from the surface of the SiGe layer. As the reaction proceeds, and more Ge is converted into GeO and removed, the surface of the SiGe layer becomes progressively more silicon-rich.

The selective removal of Ge in this manner is self-limited and will continue until either (1) all of the $GeO_2$ is consumed or (2) the SiGe surface becomes sufficiently silicon-rich that the reaction cannot proceed. In the Si-limited scenario (e.g., a relatively thick $GeO_2$ layer is deposited), the silicon concentration at which the reaction will stop is temperature dependent. For example, at a spike anneal temperature of about 1077 degrees Celsius the reaction will stop when the surface concentration of silicon is about 90 percent. Consequently, the severity of the germanium pull-out process can be tuned by adjusting the thickness of the deposited $GeO_2$ or by adjusting the anneal temperature.

Turning now to a more detailed description of aspects of the present invention, FIGS. 1-7C depict the progressive formation of stacked silicon nanotubes according to one or more embodiments of the invention. FIGS. 8A-13B depict how to integrate these stacked silicon nanotubes as a channel material to build transistors.

Figure 1:
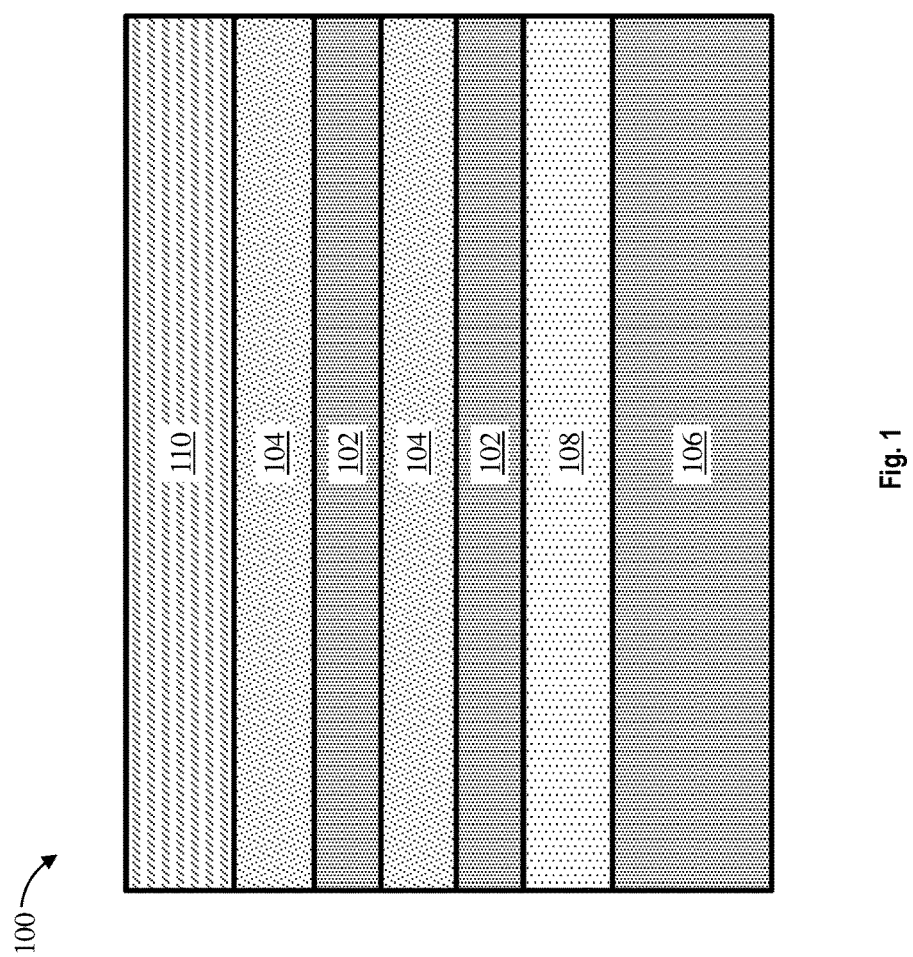
FIG. 1 depicts a cross-sectional view of a semiconductor structure after a processing operation according to one or more embodiments of the invention.

FIG. 1 depicts a cross-sectional view of a semiconductor structure 100 during an intermediate operation of a method of fabricating a semiconductor device according to one or more embodiments of the invention. As depicted in FIG. 1, a partially fabricated semiconductor device can include a stack of one or more semiconductor layers 102 alternating with one or more sacrificial layers 104 formed over a substrate 106. While depicted as a stack having two semiconductor layers alternating with two sacrificial layers, it is understood that the stack can include any number of semiconductor layers alternating with a corresponding number of sacrificial layers.

Each of the semiconductor layers 102 can have a height ranging from 1 nm to 150 nm, for example, from 10 nm to 50 nm. In some embodiments of the present invention, the semiconductor layers 102 have a height of about 12 nm. The semiconductor layers 102 can be made of any suitable semiconductor channel material, such as, for example, monocrystalline Si, III-V compound semiconductor, or II-VI compound semiconductor, so long as the semiconductor layers 102 are not consumed by the germanium pull-out process previously discussed herein. In some embodiments of the invention, the semiconductor layers 102 are made of silicon.

Each of the sacrificial layers 104 can have a height ranging from 1 nm to 150 nm, for example, from 10 nm to 50 nm. In some embodiments of the present invention, the sacrificial layers 104 have a height of about 12 nm. In some embodiments of the invention, the sacrificial layers 104 are made of SiGe. As discussed previously herein, Ge near a surface of the sacrificial layers 104 will be removed during a subsequent germanium pull-out process. Accordingly, the initial Ge concentration in the sacrificial layers 104 can affect the thickness of the $GeO_2$ layer required to sufficiently deplete the surface regions of the sacrificial layers 104 of Ge. In some embodiments of the present invention, the sacrificial layers 104 include an initial Ge concentration of about 40 or 50 percent, although other Ge concentrations are within the contemplated scope of the invention.

The semiconductor layers 102 and the sacrificial layers 104 can be formed by a variety of methods, such as, for example, ultrahigh vacuum chemical vapor deposition (UHVCVD), rapid thermal chemical vapor deposition (RTCVD), metalorganic chemical vapor deposition (MOCVD), low-pressure chemical vapor deposition (LP-CVD), limited reaction processing CVD (LRPCVD), and MBE. In some embodiments of the present invention, the semiconductor layers 102 and the sacrificial layers 104 are epitaxially grown from gaseous or liquid precursors. Epitaxial semiconductor materials can be grown using vapor-phase epitaxy (VPE), MBE, liquid-phase epitaxy (LPE), or other suitable processes. Epitaxial silicon and SiGe can be doped during deposition (in-situ doped) by adding n-type dopants (e.g., phosphorus or arsenic) or p-type dopants (e.g., Ga, B, $BF_2$, or Al). The dopant concentration in the doped regions can range from $1 \times 10^{19}$ $cm^{-3}$ to $2 \times 10^{21}$ $cm^{-3}$, or between $1 \times 10^{20}$ $cm^{-3}$ and $1 \times 10^{21}$ $cm^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the present invention, epitaxial growth and/or deposition processes are selective to forming on semiconductor surface, and generally do not deposit material on other exposed surfaces, such as silicon dioxide or silicon nitride surfaces.

In some embodiments of the present invention, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments of the present invention, the doped regions include silicon. In some embodiments of the present invention, the doped regions include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

The substrate 106 can be made of any suitable substrate material, such as, for example, monocrystalline Si, SiGe, SiC, III-V compound semiconductor, II-VI compound semiconductor, or semiconductor-on-insulator (SOI). In some embodiments of the present invention, the substrate 106 includes a buried oxide layer 108. The buried oxide layer 108 can be made of any suitable dielectric material, such as, for example, a silicon oxide. In some embodiments of the present invention, the buried oxide layer 108 is formed to a thickness of about 145 nm, although other thicknesses are within the contemplated scope of the invention. The semiconductor structure 100 can be electrically isolated from other regions of the substrate 106 by a shallow trench isolation region (not depicted).

A hard mask 110 is formed on a topmost surface of the sacrificial layers 104. In some embodiments of the present invention, the hard mask 110 includes a nitride, such as silicon nitride. In some embodiments of the present invention, the hard mask 110 is formed to a thickness of 40 nm, although other thicknesses are within the contemplated scope of the invention.

Figure 2:
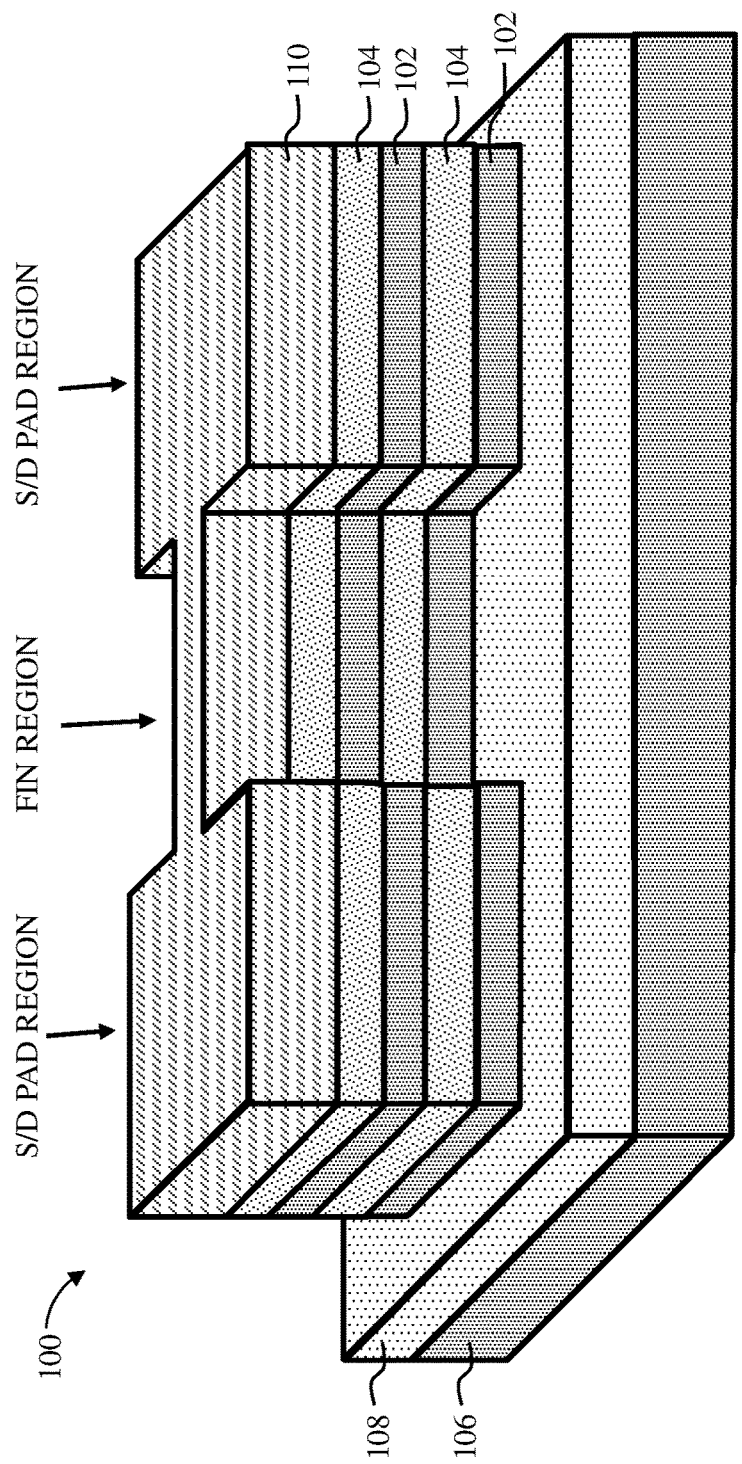
FIG. 2 depicts an isometric view of the semiconductor structure after a processing operation according to one or more embodiments of the invention.

FIG. 2 depicts an isometric view of the semiconductor structure 100 during an intermediate operation of a method of fabricating a semiconductor device according to one or more embodiments of the invention. As depicted in FIG. 2, the semiconductor layers 102 and the sacrificial layers 104 are patterned into one or more fins (in a Fin Region) bridged between two source/drain pads (in S/D Pad Regions, also referred to as anchor pads) along a first direction. While depicted as a single fin for ease of illustration, it is understood that the semiconductor layers 102 and the sacrificial layers 104 can be patterned into any number of parallel fins. In other words, multiple parallel fins can bridge the two source/drain pad regions.

The semiconductor layers 102 in the Fin Region can have a width (measured along the first direction) ranging from 5 nm to 40 nm, for example, from 10 nm to 20 nm. In some embodiments of the present invention, the semiconductor layers 102 in the Fin Region are patterned to a width of about 12 nm, although other widths are within the contemplated scope of the invention. It is further understood that the width of the semiconductor layers 102 in the Fin Region need to be the same as the height of the semiconductor layers 102. The semiconductor layers 102 in the Fin Region can have a length (measured in a second direction, orthogonal to the first direction) ranging from 5 nm to 100 nm or more, for example, from 15 nm to 25 nm, although other fin lengths are within the contemplated scope of the invention.

FIG. 3 depicts an isometric view of the semiconductor structure 100 during an intermediate operation of a method of fabricating a semiconductor device according to one or more embodiments of the invention. As depicted in FIG. 3, portions of the semiconductor layers 102 in the Fin Region are removed to expose a surface of the sacrificial layers 104. After removing these portions of the semiconductor layers 102, the portion of the sacrificial layers 104 in the Fin Region defines one or more stacked nanowires. In other words, one or more stacked nanowires are released in the Fin Region.

The semiconductor layers 102 can be removed selective to the sacrificial layers 104 using any suitable process known for etching silicon selective to SiGe. In some embodiments of the present invention, the semiconductor layers 102 are removed using a wet etch, a dry etch, or a combination of sequential wet and/or dry etches. An example of an etchant that can enable this process is Ammonia. In some embodiments of the present invention, the silicon etch results in a slight recess of the exposed sidewalls of the semiconductor layers 102 in the S/D Pad Regions.

FIG. 4A depicts a cross-sectional view of the semiconductor structure 100 along the line A-A' of FIG. 3 during an intermediate operation of a method of fabricating a semiconductor device according to one or more embodiments of the invention. FIGS. 4B and 4C depict cross-sectional views of the semiconductor structure 100 along the lines B-B' (Fin Region) and C-C' (S/D Pad Region) of FIG. 3, respectively, during an intermediate operation of a method of fabricating a semiconductor device according to one or more embodiments of the invention. As depicted in each of FIGS. 4A-4C, the hard mask 110 is removed and a germanium pull-out layer 400 (also referred to simply as a pull-out layer) is formed over the semiconductor structure 100. In some embodiments of the present invention, the germanium pull-out layer 400 is conformally formed using, for example, atomic layer deposition (ALD). In some embodiments of the present invention, the germanium pull-out layer 400 includes $GeO_2$ conformally deposited to a thickness of about 3 nm, although other thicknesses are within the contemplated scope of the invention.

As depicted in FIGS. 4A and 4B, an airgap can be formed between the adjacent sacrificial layers 104 in the Fin Region, depending on the formed thickness of the semiconductor layers 102 and the germanium pull-out layer 400. For example, if the thickness of the semiconductor layers 102 is about 12 nm and the thickness of the germanium pull-out layer 400 is about 3 nm, then the airgap will have a thickness of about 6 nm.

Figure 5A:
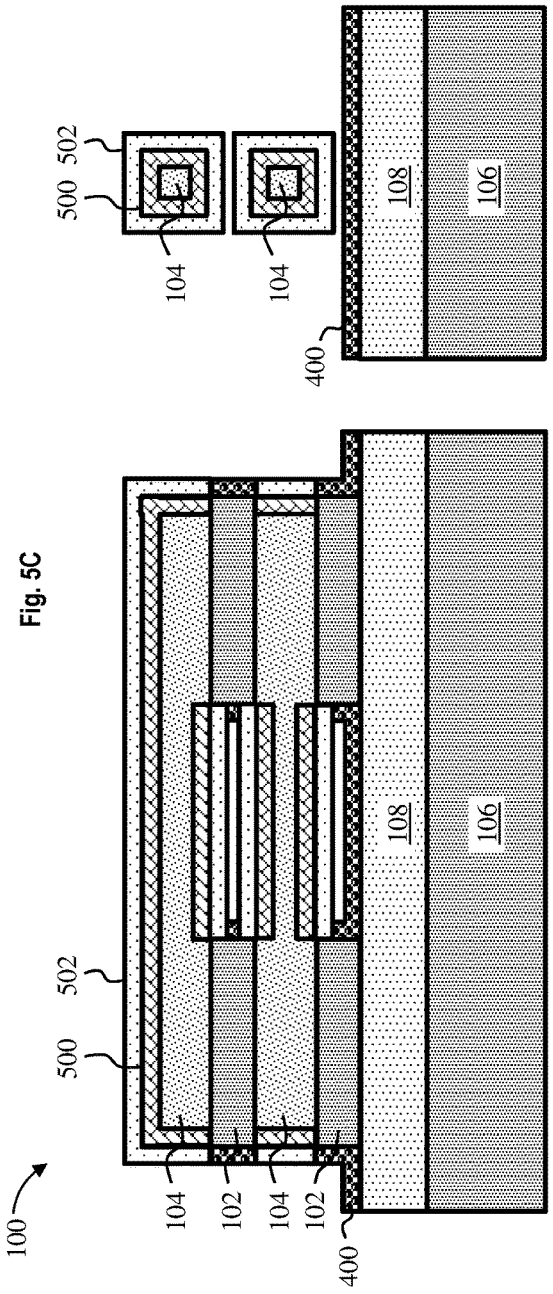
FIG. 5A depicts a cross-sectional view of the semiconductor structure shown in FIG. 3 taken along the line A-A' after a processing operation according to one or more embodiments of the invention.
Figure 5B:
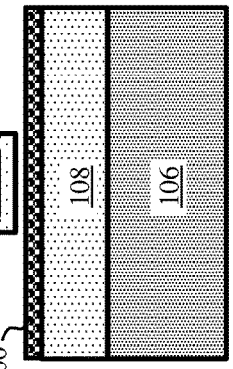
FIG. 5B depicts a cross-sectional view of the semiconductor structure shown in FIG. 3 taken along the line B-B' after a processing operation according to one or more embodiments of the invention.
Figure 5C:
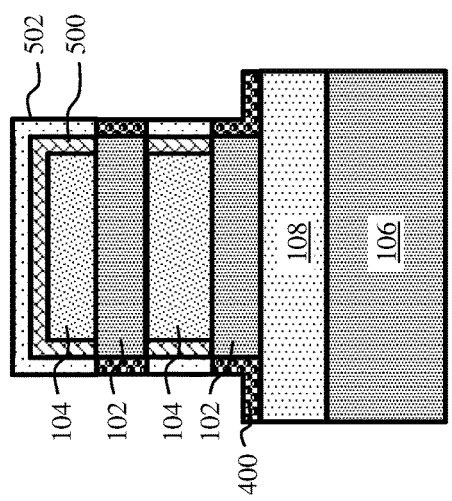
FIG. 5C depicts a cross-sectional view of the semiconductor structure shown in FIG. 3 taken along the line C-C' after a processing operation according to one or more embodiments of the invention.

FIG. 5A depicts a cross-sectional view of the semiconductor structure 100 along the line A-A' of FIG. 3 during an intermediate operation of a method of fabricating a semiconductor device according to one or more embodiments of the invention. FIGS. 5B and 5C depict cross-sectional views of the semiconductor structure 100 along the lines B-B' (Fin Region) and C-C' (S/D Pad Region) of FIG. 3, respectively, during an intermediate operation of a method of fabricating a semiconductor device according to one or more embodiments of the invention. As depicted in each of FIGS. 5A-5C, portions of the germanium pull-out layer 400 in contact with the sacrificial layers 104 react to form a silicon-rich layer 500 during a germanium pull-out thermal process according to the formula:

$$Ge+GeO_2 \rightarrow 2GeO. \tag{I}$$

Figure 6B:
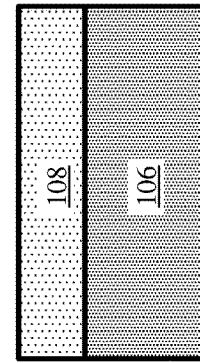
FIG. 6B depicts a cross-sectional view of the semiconductor structure shown in FIG. 3 taken along the line B-B' after a processing operation according to one or more embodiments of the invention.
Figure 6C:
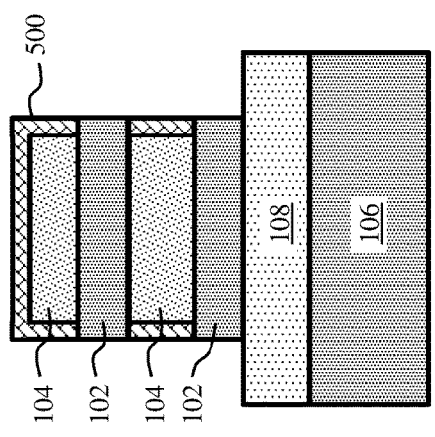
FIG. 6C depicts a cross-sectional view of the semiconductor structure shown in FIG. 3 taken along the line C-C' after a processing operation according to one or more embodiments of the invention.
Figure 6A:
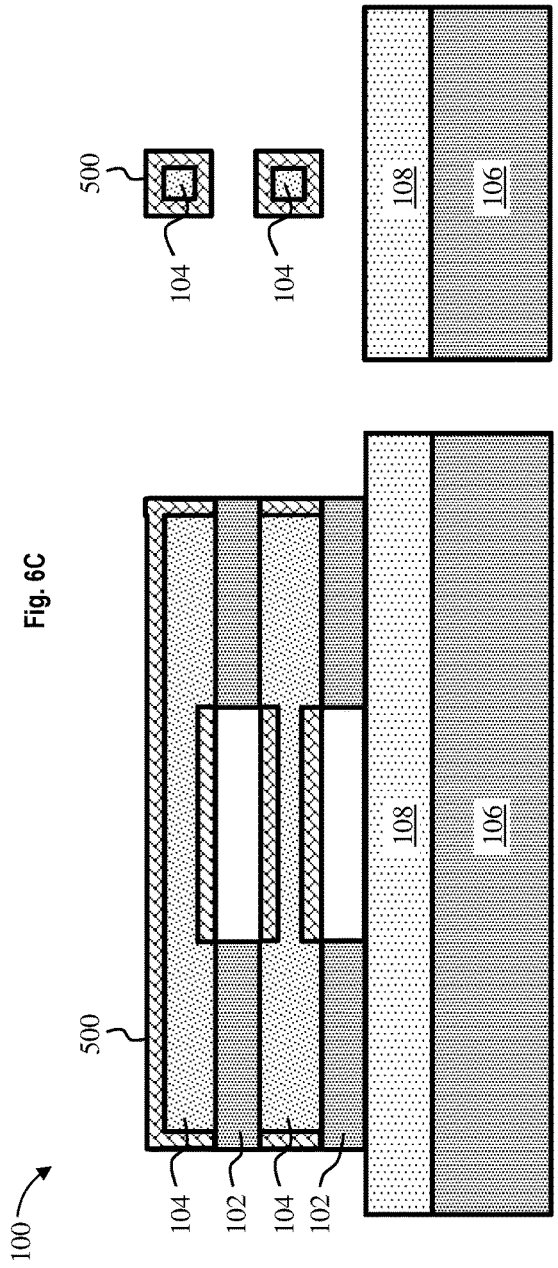
FIG. 6A depicts a cross-sectional view of the semiconductor structure shown in FIG. 3 taken along the line A-A' after a processing operation according to one or more embodiments of the invention.

In some embodiments of the present invention, the thermal process is a high temperature anneal. In some embodiments of the present invention, the thermal process is a high temperature spike anneal at a temperature above about 900 degrees Celsius. GeO is a volatile species, and any formed during this process can be removed using known processes, such as, for example, off-gassing, venting or bake-out. Unreacted portions of the germanium pull-out layer 400 (i.e., those portions in contact with the semiconductor layers 102 or the buried oxide layer 108) remain and are subsequently removed (FIGS. 6A-6C). In some embodiments of the present invention, some of the oxygen in the germanium pull-out layer 400 reacts with silicon in the sacrificial layers 104 to form a silicon oxide layer 502 over the silicon-rich layer 500.

As discussed previously herein, the selective removal of Ge from the sacrificial layers 104 in this manner is self-limited and will continue until either (1) all of the $GeO_2$ in the germanium pull-out layer 400 is consumed or (2) the silicon-rich layer 500 becomes sufficiently silicon-rich that the reaction cannot proceed. In this manner, the final thickness of the silicon-rich layer 500 depends on the deposited thickness of the germanium pull-out layer 400. For example, if the germanium pull-out layer 400 is deposited to a thickness of about 3 nm, the final thickness of the silicon-rich layer 500 will be about 3 nm.

FIG. 6A depicts a cross-sectional view of the semiconductor structure 100 along the line A-A' of FIG. 3 during an intermediate operation of a method of fabricating a semiconductor device according to one or more embodiments of the invention. FIGS. 6B and 6C depict cross-sectional views of the semiconductor structure 100 along the lines B-B' (Fin Region) and C-C' (S/D Pad Region) of FIG. 3, respectively, during an intermediate operation of a method of fabricating a semiconductor device according to one or more embodiments of the invention. As depicted in each of FIGS. 6A-6C, remaining, unreacted portions of the germanium pull-out layer 400 and the silicon oxide layer 502 are removed. The germanium pull-out layer 400 and the silicon oxide layer 502 can be removed using a wet etch, a dry etch, or a combination of sequential wet and/or dry etches. In some embodiments of the present invention, the germanium pull-out layer 400 and/or the silicon oxide layer 502 are removed selective to the sacrificial layers 104 or the semiconductor layers 102.

FIG. 7A depicts a cross-sectional view of the semiconductor structure 100 along the line A-A' of FIG. 3 during an intermediate operation of a method of fabricating a semiconductor device according to one or more embodiments of the invention. FIGS. 7B and 7C depict cross-sectional views of the semiconductor structure 100 along the lines B-B' (Fin Region) and C-C' (S/D Pad Region) of FIG. 3, respectively, during an intermediate operation of a method of fabricating a semiconductor device according to one or more embodiments of the invention. As depicted in each of FIGS. 7A-6C, portions of the silicon-rich layer 500 can be removed (patterned) to expose portions (sidewalls) of the sacrificial layers 104. The sacrificial layers 104 can then be removed to free the silicon-rich layer 500, resulting in stacked silicon nanotubes 700 in the Fin Region. In some embodiments of the present invention, the silicon-rich layer 500 includes a thickness of about 3 nm, and the stacked silicon nanotubes 700 each include an outer diameter of about 12 nm and an inner diameter of about 6 nm, although other nanotube diameters are within the contemplated scope of the invention. These stacked silicon nanotubes are anchored in the S/D Pad Region to the semiconductor layers 102. In some embodiments of the present invention, the sacrificial layers 104 are removed selective to the silicon-rich layer 500 and the semiconductor layers 102, using, for example, an SiGe etch selective to silicon. An example SiGe etch process selective to silicon is a selective HCl gas etch.

FIG. 8A depicts a cross-sectional view of a semiconductor structure 800 along the line A-A' of FIG. 3 during an intermediate operation of a method of fabricating a semiconductor device according to one or more embodiments of the invention. FIG. 8B depicts a cross-sectional view of the semiconductor structure 800 along the lines B-B' of FIG. 3 during an intermediate operation of a method of fabricating a semiconductor device according to one or more embodiments of the invention. As depicted, FIGS. 8A and 8B illustrate the formation of a sacrificial gate 802 (also known as a dummy gate) after the unreacted portions of the germanium pull-out layer 400 and the silicon oxide layer 502 are removed (as illustrated in FIGS. 6A, 6B, and 6C).

The sacrificial gate 802 can be made of any suitable material, such as, for example, amorphous silicon or polysilicon. The sacrificial gate 802 can be formed using any known method for patterning a sacrificial gate, such as, for example, a polysilicon fill and a wet etch, a dry etch, or a combination of sequential wet and/or dry etches. In some embodiments of the present invention, a hard mask 804 (also known as a cap or capping layer) is formed on the sacrificial gate 802. In some embodiments of the present invention, the sacrificial gate 802 is formed by patterning the hard mask 804 and removing uncovered portions of the sacrificial gate 802. The hard mask 804 can be made of any suitable material, such as, for example, a silicon nitride. In some embodiments of the present invention, a second hard mask (not depicted) is formed on the hard mask 804, to form a bilayer hard mask. The second hard mask can include an oxide, such as, for example, a silicon oxide.

Spacers 806 (also known as sidewall spacers or gate spacers) are formed on sidewalls of the sacrificial gate 802. In some embodiments of the present invention, the spacers 806 are formed using a CVD, PECVD, ALD, PVD, chemical solution deposition, or other like processes in combination with a wet or dry etch process. The spacers 806 can be made of any suitable material, such as, for example, a low-k dielectric, a nitride, silicon nitride, silicon oxide, SiON, SiC, SiOCN, or SiBCN. The spacers 806 can be formed to a thickness of about 5 to 10 nm, although other thicknesses are within the contemplated scope of the invention.

FIG. 9A depicts a cross-sectional view of a semiconductor structure 800 along the line A-A' of FIG. 3 during an intermediate operation of a method of fabricating a semiconductor device according to one or more embodiments of the invention. FIG. 9B depicts a cross-sectional view of the semiconductor structure 800 along the lines B-B' of FIG. 3 during an intermediate operation of a method of fabricating a semiconductor device according to one or more embodiments of the invention. As depicted in FIGS. 9A and 9B, an interlayer dielectric 900 is formed over the semiconductor structure 800. The interlayer dielectric 900 can be made of any suitable material, such as, for example, porous silicates, carbon doped oxides, silicon dioxides, silicon nitrides, silicon oxynitrides, or other dielectric materials. Any known manner of forming the interlayer dielectric 900 can be utilized, such as, for example, CVD, PECVD, ALD, flowable CVD, spin-on dielectrics, or PVD. In some embodiments of the present invention, the interlayer dielectric 900 is planarized to a top surface of the spacers 806 and/or the hard mask 804, using, for example, a CMP process. Once formed, the interlayer dielectric 900 is patterned with open trenches (also known as vias) to expose a surface of the buried oxide layer 108 and sidewalls of the sacrificial layers 104 in the S/D Pad Region using, for example, a wet etch, a dry etch, or a combination of sequential wet and/or dry etches.

FIG. 10A depicts a cross-sectional view of a semiconductor structure 800 along the line A-A' of FIG. 3 during an intermediate operation of a method of fabricating a semiconductor device according to one or more embodiments of the invention. FIG. 10B depicts a cross-sectional view of the semiconductor structure 800 along the lines B-B' of FIG. 3 during an intermediate operation of a method of fabricating a semiconductor device according to one or more embodiments of the invention. As depicted in FIGS. 10A and 10B, the sacrificial layers 104 are removed from the semiconductor structure 800. In some embodiments of the present invention, the sacrificial layers 104 are removed using an isotropic etch. In some embodiments of the present invention, the sacrificial layers 104 (SiGe) are etched selective to the semiconductor layers 102 (Si) using an isotropic SiGe etch selective to silicon. Consequently, the SiGe core (the sacrificial layers 104) inside the silicon-rich layer 500 is removed, resulting in stacked silicon nanotubes 1000 in the Fin Region.

FIG. 11A depicts a cross-sectional view of a semiconductor structure 800 along the line A-A' of FIG. 3 during an intermediate operation of a method of fabricating a semiconductor device according to one or more embodiments of the invention. FIG. 11B depicts a cross-sectional view of the semiconductor structure 800 along the lines B-B' of FIG. 3 during an intermediate operation of a method of fabricating a semiconductor device according to one or more embodiments of the invention. As depicted in FIGS. 11A and 11B, a dielectric core 1100 is formed inside the stacked silicon nanotubes 1000. The dielectric core 1100 can be made of any suitable material, such as, for example, porous silicates, carbon doped oxides, silicon dioxides, silicon nitrides, silicon oxynitrides, or other dielectric materials. Any known manner of forming the dielectric core 1100 can be utilized, such as, for example, CVD, PECVD, ALD, flowable CVD, spin-on dielectrics, or PVD. In some embodiments of the present invention, an etch back process is use to remove excess portions of the dielectric core 1100 (i.e., those portions outside of the silicon nanotubes 1000). In some embodiments of the present invention, the etch back results in the recessing of portions of the silicon nanotubes 1000.

FIG. 12A depicts a cross-sectional view of a semiconductor structure 800 along the line A-A' of FIG. 3 during an intermediate operation of a method of fabricating a semiconductor device according to one or more embodiments of the invention. FIG. 12B depicts a cross-sectional view of the semiconductor structure 800 along the lines B-B' of FIG. 3 during an intermediate operation of a method of fabricating a semiconductor device according to one or more embodiments of the invention. As depicted in FIGS. 11A and 11B, source and drain regions 1200 are formed in the S/D Pad Region adjacent to the silicon nanotubes 1000. The source and drain regions 1200 can be epitaxially formed by a variety of methods, such as, for example, in-situ doped epitaxy, doped following the epitaxy, or by implantation and plasma doping. The source and drain regions 1200 can be epitaxial semiconductor materials grown from gaseous or liquid precursors, as described previously herein. The source and drain regions 1200 can be doped with n-type dopants (e.g., phosphorus or arsenic) or p-type dopants (e.g., boron or gallium). The dopant concentration in the source and drain regions 1200 can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$. In some embodiments of the present invention, the trenches in the interlayer dielectric 900 are refilled with additional dielectric material after forming the source and drain regions 1200.

FIG. 13A depicts a cross-sectional view of a semiconductor structure 800 along the line A-A' of FIG. 3 during an intermediate operation of a method of fabricating a semiconductor device according to one or more embodiments of the invention. FIG. 13B depicts a cross-sectional view of the semiconductor structure 800 along the lines B-B' of FIG. 3 during an intermediate operation of a method of fabricating a semiconductor device according to one or more embodiments of the invention. As depicted in FIGS. 13A and 13B, the sacrificial gate 802 can be removed and replaced with a conductive gate 1300 (hereinafter, gate 1300). The gate 1300 can be made of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive material can further include dopants that are incorporated during or after deposition.

In some embodiments of the present invention, the gate 1300 is a high-k metal gate (HKMG) and a high-k dielectric film (not depicted) is formed between the gate 1300 and the silicon nanotubes 1000. In some embodiments of the present invention, the high-k dielectric film can be used to modify the work function of the gate 1300. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the present invention, the high-k dielectric film can have a thickness of about 0.5 nm to about 4 nm. In some embodiments of the present invention, the high-k dielectric film has a thickness of about 2 nm, although other thicknesses are within the contemplated scope of the invention.

In some embodiments of the present invention, work function layers (not depicted) are formed between the high-k dielectric film and the conductive gate 1300. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layer can serve to further modify the work function of the gate 1300. The work function layers can be formed to a thickness of about 2 to 10 nm, although other thicknesses are within the contemplated scope of the invention.

Metal contacts (not depicted) can be formed on top of the gate 1300 and the source and drain regions 1200. The contacts can be of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. The conductive material can further include dopants that are incorporated during or after deposition. In some embodiments, the contacts can be copper and can include a barrier metal liner. The barrier metal liner prevents the copper from diffusing into, or doping, the surrounding materials, which can degrade their properties. Examples include tantalum nitride and tantalum (TaN/Ta), titanium, titanium nitride, cobalt, ruthenium, and manganese.

FIG. 14 depicts a flow diagram 1400 illustrating a method for forming a semiconductor device according to one or more embodiments of the invention. As shown at block 1402, a sacrificial layer is formed over a substrate. The sacrificial layer includes silicon germanium. At 1404, a germanium pull-out layer is formed on the sacrificial layer. As discussed previously herein, the germanium pull-out layer can include $GeO_2$.

At step 1406, germanium from the sacrificial layer is removed to form a silicon-rich layer on a surface of the sacrificial layer. Germanium can be removed from the sacrificial layer using a thermal anneal according to the formula:

$$Ge + GeO_2 \rightarrow 2GeO. \qquad (I)$$

FIG. 15 depicts a flow diagram 1500 illustrating a method for forming a semiconductor device according to one or more embodiments of the invention. As shown at block 1502, a semiconductor layer is formed on a substrate. At block 1504, a sacrificial layer including silicon germanium is formed on the semiconductor layer. The semiconductor layer and the sacrificial layer are patterned, at block 1506, into one or more fins in a first region of the substrate. At block 1508, portions of the semiconductor layer in the first region are removed such that a portion of the sacrificial layer in the first region defines a nanowire.

As shown at block 1510, a germanium pull-out layer is formed around the nanowire in the first region. The semiconductor device is then annealed to remove germanium from a surface of the nanowire. During the anneal, the surface of the nanowire becomes progressively more silicon-rich, as discussed previously herein.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention of the invention, epitaxial growth and/or deposition processes can be selective to forming on semiconductor surface, and may or may not deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor device, the method comprising: forming one or more stacked nanowires comprising a sacrificial material over a substrate, the sacrificial material comprising a first type of semiconductor material; forming a pull-out layer around each of the one or more stacked nanowires; reacting the pull-out layer with the first type of semiconductor material to form a silicon-rich layer on a surface of each of the one or more stacked nanowires; and removing the sacrificial material to define one or more hollow nanotubes comprising the silicon-rich layer.

2. The method of claim 1 further comprising removing portions of the silicon-rich layer such that remaining portions of the silicon-rich layer define a silicon nanotube.

3. The method of claim 1, wherein the pull-out layer comprises germanium oxide and the first type of semiconductor material comprises germanium.

4. The method of claim 3, further comprising annealing the semiconductor device at a temperature of at least 900 degrees Celsius.

5. The method of claim 4, wherein annealing the semiconductor device removes germanium from the sacrificial layer according to the formula:

$$Ge+GeO_2 \rightarrow 2GeO. \quad (I)$$

6. The method of claim 4, wherein annealing the semiconductor device comprises a temperature spike anneal.

7. The method of claim 1, wherein the sacrificial layer comprises silicon germanium having a germanium concentration of about 40 percent to about 50 percent.

8. A method for forming a semiconductor device, the method comprising:
   forming a semiconductor layer on a substrate;
   forming a sacrificial layer on the semiconductor layer, the sacrificial layer comprising silicon germanium;
   patterning the semiconductor layer and the sacrificial layer into one or more fins in a first region of the substrate;
   removing portions of the semiconductor layer in the first region such that a portion of the sacrificial layer in the first region defines a nanowire;
   forming a pull-out layer around the nanowire in the first region;

annealing the semiconductor device to remove germanium from a surface of the nanowire such that the surface of the nanowire becomes silicon-rich; and removing the sacrificial layer such that the silicon-rich surface remains and defines a hollow silicon nanotube.

9. The method of claim 8, wherein the pull-out layer comprises germanium oxide.

10. The method of claim 9, wherein annealing the semiconductor device causes germanium in the sacrificial layer to react with germanium oxide in the pull-out layer according to the formula:

$$Ge + GeO_2 \rightarrow 2GeO. \qquad (I)$$

11. The method of claim 8 further comprising filling the hollow silicon nanotube with a dielectric core.

12. The method of claim 8, wherein the semiconductor device is annealed at a temperature of at least 900 degrees Celsius.

13. The method of claim 8, wherein annealing the semiconductor device comprises a high temperature spike anneal.

14. The method of claim 8, wherein the sacrificial layer comprises a germanium concentration of about 40 percent to about 50 percent.

* * * * *